United States Patent
Reboa et al.

(10) Patent No.: US 7,618,682 B2
(45) Date of Patent: Nov. 17, 2009

(54) METHOD FOR PROVIDING AN ANTI-STICTION COATING ON A METAL SURFACE

(75) Inventors: Paul Felice Reboa, Corvallis, OR (US); Kirby Sand, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 433 days.

(21) Appl. No.: 11/527,041

(22) Filed: Sep. 25, 2006

(65) Prior Publication Data

US 2008/0074771 A1    Mar. 27, 2008

(51) Int. Cl.
*C23C 16/00* (2006.01)

(52) U.S. Cl. .................. 427/255.21; 427/248.1

(58) Field of Classification Search .............. None
See application file for complete search history.

(56) References Cited

U.S. PATENT DOCUMENTS

| | | | |
|---|---|---|---|
| 3,412,179 A | 11/1968 | Kleiner | |
| 5,523,878 A * | 6/1996 | Wallace et al. | 359/290 |
| 6,830,950 B2 | 12/2004 | Chinn et al. | |
| 6,841,079 B2 | 1/2005 | Dunbar et al. | |
| 7,045,170 B1 | 5/2006 | Hankins et al. | |
| 2002/0164879 A1* | 11/2002 | Leung et al. | 438/706 |
| 2004/0261703 A1* | 12/2004 | Kobrin et al. | 118/715 |
| 2005/0118742 A1 | 6/2005 | Henning et al. | |
| 2005/0272599 A1 | 12/2005 | Kramer et al. | |
| 2006/0000773 A1 | 1/2006 | Glennon et al. | |
| 2006/0029732 A1 | 2/2006 | Kobrin et al. | |

FOREIGN PATENT DOCUMENTS

WO    WO 2004/079362    *  9/2004

OTHER PUBLICATIONS

Folkers, et al., "Self-Assembled Monolayers of Long-Chain Hydroxamic Acids on the Native Oxides of Metals", Langmuir, vol. 11, No. 3, 1995, pp. 813-824.

* cited by examiner

*Primary Examiner*—Timothy H Meeks
*Assistant Examiner*—Joseph Miller, Jr.

(57) ABSTRACT

A method for providing an anti-stiction coating on a metal surface includes reacting a vapor of perfluorooctylhydroxamic acid with the metal surface in a reaction chamber.

14 Claims, 3 Drawing Sheets

METHOD FOR PROVIDING AN ANTI-STICTION COATING ON A METAL SURFACE

BACKGROUND

The present disclosure relates generally to a method for providing an anti-stiction coating on a metal surface.

Stiction may occur in microelectromechanical systems (MEMS) in two different forms: between the substrate and the microstructure(s) and/or between two or more microstructures when the system is in operation. Anti-stiction coatings have been added to various surfaces in MEMS devices in an effort to prevent stiction from occurring.

Some anti-stiction coatings suitable for metal surfaces of a MEMS device include perfluorooctanoic acid (PFOA) or perfluorodecanoic acid (PFDA). While these materials are relatively compatible with the metal surfaces, they are often used at high excess levels to ensure protection of the surfaces. Furthermore, these materials may exhibit durability and volatility issues. Reduced durability of such anti-stiction coatings may result from the relatively weak bonds that are formed between the coating and the metal surface. A reduction of the contact angle when the material (e.g., PFOA on a TaAl surface) is exposed to heat indicates that the material is volatizing.

Furthermore, the reaction of some anti-stiction coatings (e.g., fluorinated decyl trichloro silane (FDTS) and/or other like materials) with metal surfaces may result in the formation of undesirable corrosive species (e.g., hydrochloric acid). Such species may attack the metal surfaces, thereby reducing reflectance and roughening the surface.

BRIEF DESCRIPTION OF THE DRAWINGS

Features and advantages of embodiments of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiments of the method and device disclosed herein advantageously incorporate a perfluorooctylhydroxamic acid anti-stiction coating on a metal surface. Perfluorooctylhydroxamic acid (PFOHXA) has similar anti-stiction properties to those of other anti-stiction materials (e.g., PFOA); however, perfluorooctylhydroxamic acid advantageously has higher temperature resistance, hydroxamic functionality, and additional bonding sites. Without being bound to any theory, it is believed that the hydroxamic functionality provides relatively large vapor pressures, thereby making the vapor phase PFOHXA relatively easy to coat on metal surfaces. Furthermore, it is believed that the additional bonding sites advantageously enhance coating durability and stability, while substantially reducing coating volatility.

The reaction of perfluorooctylhydroxamic acid with the metal surface also leaves the metal surface with substantially unaltered smoothness and reflectance. It is believed that this is due, at least in part, to the lack of corrosive species generated during the reaction.

Figure 1:
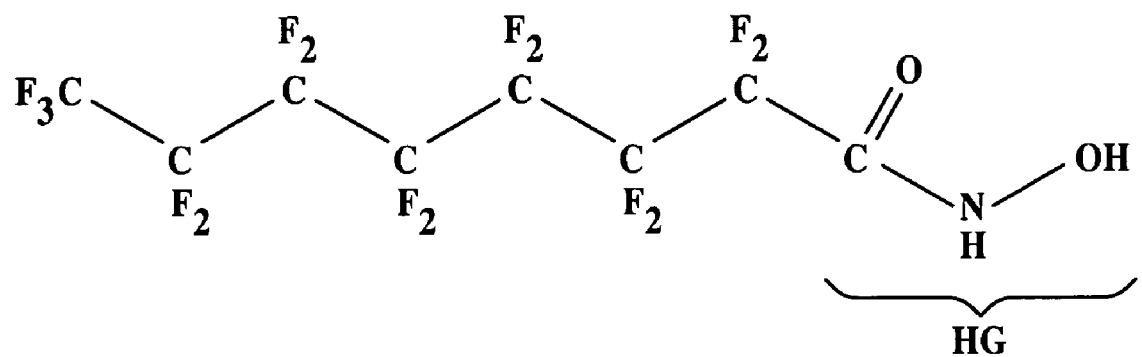
FIG. 1 is a view depicting the chemical structure of perfluorooctylhydroxamic acid.

Referring now to FIG. 1, the chemical structure of perfluorooctylhydroxamic acid is depicted. The hydroxamic group HG of the compound increases (when compared to, for example, PFOA) the number of sites available for binding to the metal surface. Generally, the oxygen atoms in the hydroxamic group HG are capable of chelating with metal atom(s) located at the surface of a device. As previously described, the hydroxamic group HG provides the perfluorooctylhydroxamic acid compound with enhanced anti-stiction properties, for example, durability. Embodiments of the method for providing the anti-stiction coating and devices including the anti-stiction coating will be described further hereinbelow.

Figure 2:
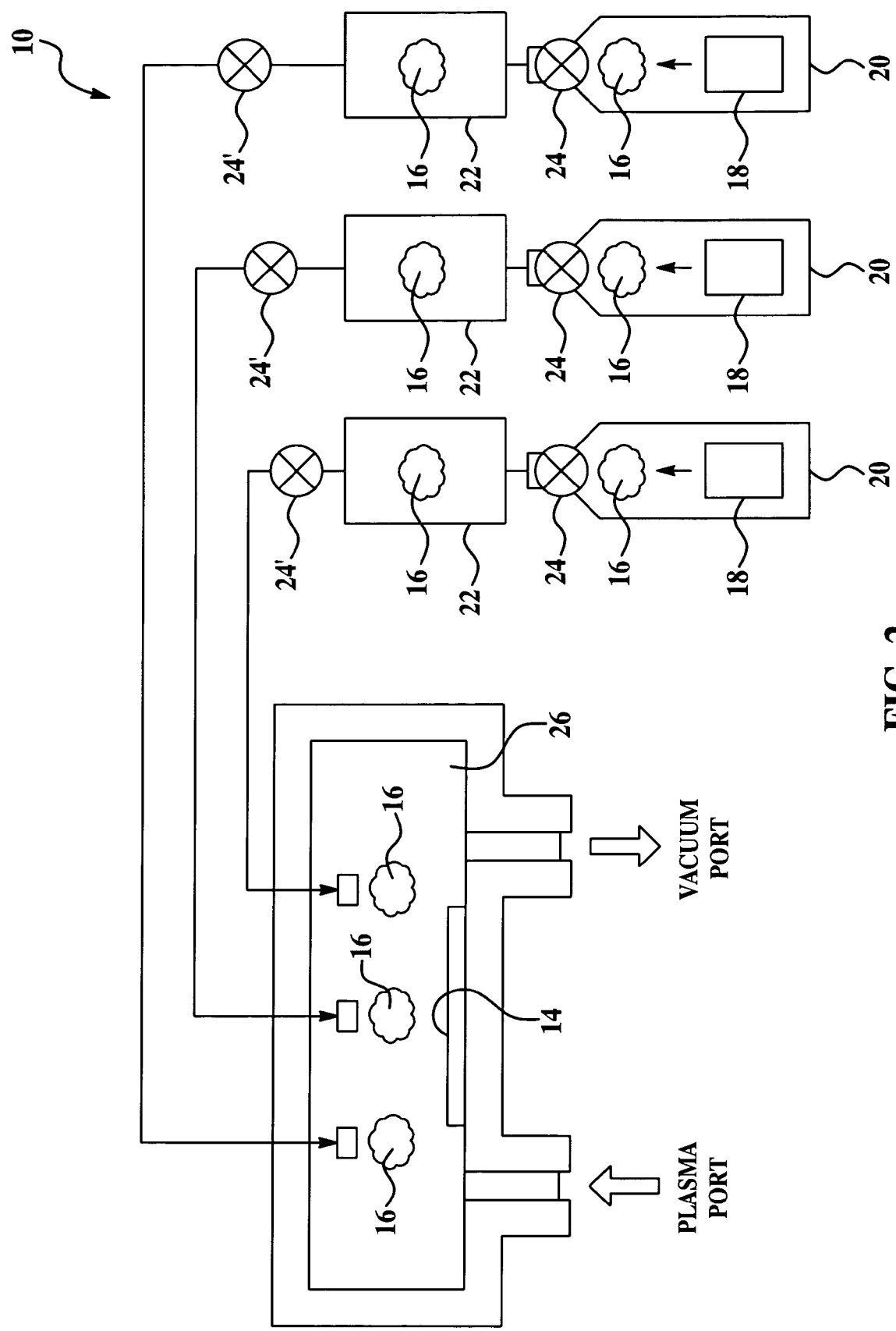
FIG. 2 is a schematic view of an embodiment of an apparatus for providing an anti-stiction coating on a metal surface.

FIG. 2 depicts an apparatus 10 for applying the perfluorooctylhydroxamic acid anti-stiction coating 12 (shown in FIG. 3) to a metal surface 14. Generally, an embodiment of the method includes reacting a vapor 16 of the perfluorooctylhydroxamic acid with the metal surface 14 to which the coating 12 is to be applied.

The metal surface 14 may include any suitable higher valence metal(s). Non-limiting examples of such metals include aluminum, aluminum nitride, aluminum copper, tantalum aluminum, titanium nitride, or the like, or combinations thereof. It is to be understood that the reaction disclosed herein generally is not suitable for noble metals, such as gold, platinum, silver, or the like. The metal surface 14 may be a surface of a microelectromechanical system (schematically depicted as reference numeral 100 in FIG. 3). It is to be understood that any suitable MEMS device may be used. In a non-limiting embodiment, the MEMS device may be a single gap Fabry-Perot optical device, a dual gap Fabry-Perot optical device, microfluidic devices, and/or any other device with moving mirrors.

Prior to reacting the vapor 16 with the metal surface 14, the method includes subliming a solid 18 of the perfluorooctylhydroxamic acid to form the vapor 16. As depicted in FIG. 2, subliming takes place in one or more vessels 20. In an embodiment, sublimation of the solid 18 is accomplished at a temperature ranging from about 70° C. to about 90° C. In a non-limiting example, the sublimation temperature is about 80° C. It is to be understood that the vessel(s) 20 is/are maintained at a pressure suitable for subliming the solid 18. As a non-limiting example, the vessel(s) 20 are maintained at pressures less than about 100 mTorr.

Each of the vessels 20 is in selective fluid communication with a respective expansion chamber 22. A valve 24 is operatively disposed along each of the lines (e.g., pipe, tube, etc.) that fluidly connect each vessel 20 with the respective expansion chamber 22. In an embodiment, the valve(s) 24 is/are pneumatically operated and software controlled. The valve(s) 24 may be switched between an "ON" and an "OFF" position as desired, thereby allowing for the selective control of the flow of vapor 16 from the vessel 20 to the respective expansion chamber 22. Generally, an amount of vapor 16 that is desirable for the reaction with the metal surface 14 is allowed to flow into the expansion chamber 22. It is to be understood, however, that additional vapor 16 may be transferred to the expansion chamber 22 as desired.

The expansion chamber(s) 22 is/are maintained at a temperature and a pressure suitable for temporarily storing the perfuorooctylhydroxamic acid vapor 16. In an embodiment, the expansion chamber 22 temperature ranges from about 70° C. to about 110° C., and the pressure ranges from about 0.2 Torr to about 2 Torr. Generally, the expansion chamber(s) 22 temperature and pressure are higher than those of the vessel (s) 20 and the reaction chamber 26 (described further hereinbelow).

While FIG. 2 depicts three vessels 20 and three expansion chambers 22, it is to be understood that any number of vessels 20 and expansion chambers 22 may be used in the embodiment(s) disclosed herein.

Each of the expansion chambers 22 is also in selective fluid communication with a reaction chamber 26. In an embodiment, the reaction chamber 26 has been evacuated, which may aid in achieving pressure equilibrium between chambers 22 and 26. In another embodiment, the reaction chamber 26 is under vacuum. Another valve 24' is operatively disposed along each of the lines (e.g., pipe, tube, etc.) that fluidly connect the respective expansion chambers 22 to a reaction chamber 26. In an embodiment, the valve(s) 24' is/are pneumatically operated and software controlled. The valve(s) 24' may be switched between an "ON" and an "OFF" position as desired, thereby allowing for the selective control of the flow of vapor 16 from the expansion chamber(s) 22 to the evacuated reaction chamber 26. It is to be understood that a desirable pressure of vapor 16 for the reaction chamber 26 may be achieved when the valve(s) 24' are opened to an "ON" position and the pressures of the chamber(s) 22, 26 equilibrate. As such, vapor 16 pressure of the expansion chamber(s) 22 may be altered depending, at least in part, on the amount of pressure needed to equilibrate with the reaction chamber 26. In an embodiment, a portion of the stored vapor 16 is allowed to transfer to the reaction chamber 26. It is to be understood that additional vapor 16 may be transferred to the reaction chamber 26 as may be needed to obtain pressure equilibrium between the chambers 22, 26.

Figure 3:
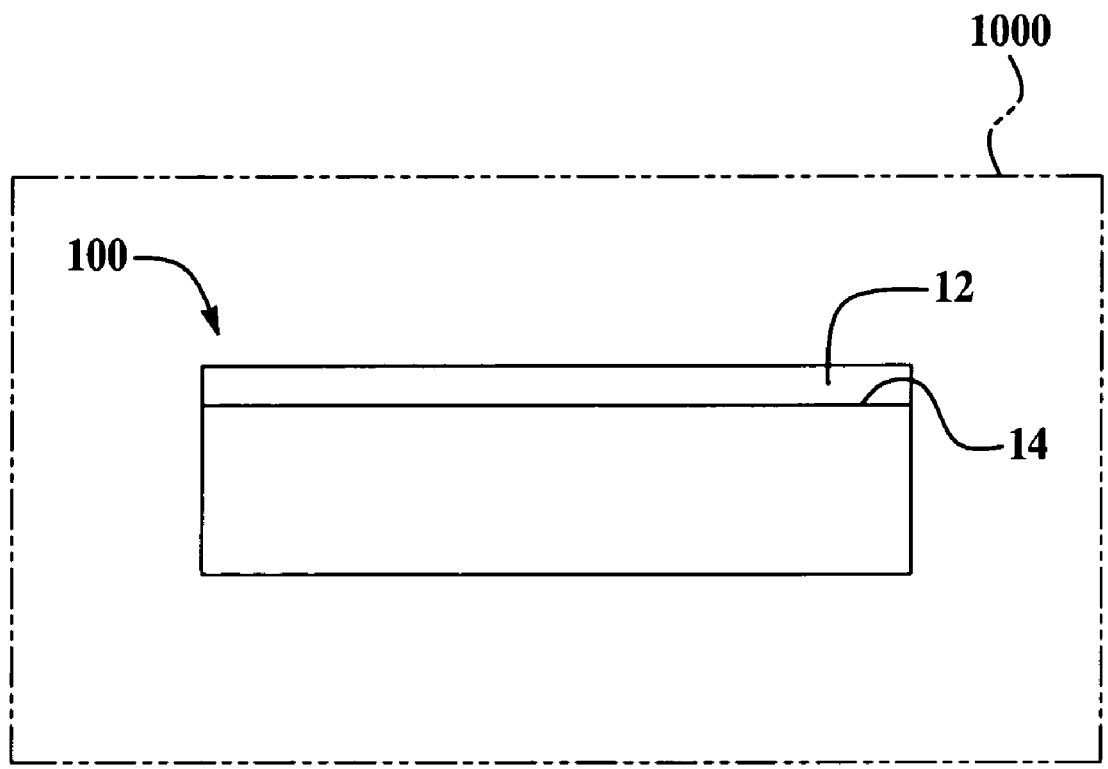
FIG. 3 is a schematic view of an embodiment of a perfluorooctylhydroxamic acid anti-stiction coating on a metal surface of a MEMS device operatively disposed in another device.

Generally, the equilibrated vapor pressure in the reaction chamber 26 is suitable to obtain the desirable amount of coating coverage and/or density (coating 12 is depicted in FIG. 3).

In an embodiment, the reaction chamber 26 is a vacuum chamber that is maintained at a temperature and pressure suitable for carrying out the reaction between the vapor 16 and the metal surface 14. In a non-limiting example, the reaction chamber 26 has a temperature ranging from about 40° C. to about 70° C., and a pressure ranging from about 30 mTorr to about 200 mTorr.

In an embodiment of the method, the perfluorooctylhydroxamic acid vapor 16 is allowed to substantially continuously flow over the exposed metal surface 14 for a time sufficient to substantially complete the reaction and to achieve the proper molecular orientation (which is detectable via the contact angle). As previously described, the oxygen atoms of the hydroxamic group HG chelate with the metal atoms at the metal surface 14. As a non-limiting example, the reaction time ranges from about 5 minutes to about 10 minutes. Alternately, the reaction time may be up to, or greater than, 30 minutes. It is to be understood, however, that the reaction time may vary, depending, at least in part, on the amount of metal surface 14 and vapor 16 available, the temperature, the reaction conditions, or the like, or combinations thereof.

Upon completion of the reaction between the perfluorooctylhydroxamic acid vapor 16 and the metal surface 14, the reaction chamber 26 and the expansion chamber 22 may be purged with nitrogen and evacuated. Purging may be accomplished for any desirable number of cycles. As a non-limiting example, at least three purging cycles are performed.

It is to be understood that the lines that fluidly connect the respective vessel(s) 20 to the respective expansion chamber (s) 22, and the respective expansion chamber(s) 22 to the reaction chamber 26 may be heated to a temperature suitable for maintaining the vapor phase 16 of the perfluorooctylhydroxamic acid. It is believed that the heated lines may substantially prevent condensation of the vapor 16 when flowing from vessel(s) 20, to expansion chamber(s) 22, to reaction chamber 26. In an embodiment, the heated lines may have a temperature ranging from about 70° C. to about 110° C.

In an embodiment, the perfluorooctylhydroxamic acid anti-stiction coating 12 may be used in an embodiment of a metal surface 14 having an adhesion layer (not shown) and another anti-stiction coating (not shown) established at least on portions thereof. As a non-limiting example, $SiCl_4$ may be deposited and reacted with water to form a $SiO_2$ thin layer on the metal surface 14. Another anti-stiction coating (e.g., fluorinated decyl trichlorosilane (FDTS)) may be established on this thin layer. The metal surface 14 may then be reacted with the vapor 16, and any free metal sites will bind with the vapor 16 to form the perfluorooctylhydroxamic acid anti-stiction coating 12 at those sites. Excess perfluorooctylhydroxamic acid may remain on the other anti-stiction coating to migrate to metal sites where the $SiO_2$ thin layer wears off, for example, from usage. In this embodiment, the perfluorooctylhydroxamic acid provides a self-healing characteristic to the metal surface 14.

In another embodiment, the microelectromechanical system device may also include non-metal surfaces. It is to be understood that such non-metal surfaces may have an adhesion coating established thereon. Non-limiting examples of suitable adhesion coatings are formed via the deposition of (and, in some embodiments, subsequent reaction with water, active surface groups, and/or other catalysts) tetraethyl-o-silane, tetrakis(dimethylamino)-silane, silicon tetrachloride, and/or the like, and/or combinations thereof.

In still another embodiment, the metal surface 14 may be reacted with a silane coupling agent prior to the reaction with the vapor 16. As a non-limiting example, an amine-terminated silane coupling agent (e.g., 3-aminopropyltrimethoxy silane) may be reacted with the vapor 16 to form another embodiment of the anti-stiction coating 12.

Referring now to FIG. 3, an embodiment of the microelectromechanical system device 100 is shown operatively disposed in another device 1000. The device 1000 may be other MEMS device(s), microfluidic device(s), electronic device (s), sensing device(s), display device(s), optical switching device(s), or combinations thereof.

As depicted in FIG. 3, the MEMS device 100 includes the metal surface 14 and the perfluorooctylhydroxamic acid anti-stiction coating 12 established thereon. It is to be understood that the perfluorooctylhydroxamic acid anti-stiction coating 12 is established via embodiment(s) of the method disclosed herein. As previously described, some embodiments of the device 100 may include one or more of adhesion layer(s), other anti-stiction coatings, silane coupling agent layers, or other layers/coatings, as desired and/or suitable.

In another embodiment, the MEMS device 100 may include one or more non-metal surfaces, in addition to the metal surface(s) 14. In this embodiment, the perfluorooctylhydroxamic acid anti-stiction coating 12 may be coated on the metal surface(s) 14, and another anti-stiction coating that is more suitable for non-metal surfaces may be coated on the non-metal surfaces.

Embodiments of the method and device disclosed herein include, but are not limited to the following advantages. In addition to having similar anti-stiction properties to those of other anti-stiction materials (e.g., PFOA), the perfluorooctylhydroxamic acid anti-stiction coating 12 also advantageously has higher temperature resistance, hydroxamic functionality and additional bonding sites. It is believed that the perfluorooctylhydroxamic acid anti-stiction coating 12 is substantially durable and stable, is less volatile, and is relatively easy to apply. Furthermore, the smoothness and reflectivity of the metal surface 14 (to which the anti-stiction coating 12 is applied) advantageously remains substantially unaltered after the reaction comes to completion.

To further illustrate embodiment(s) of the present disclosure, examples are given herein. It is to be understood that these examples are provided for illustrative purposes and are not to be construed as limiting the scope of the disclosed embodiment(s).

EXAMPLE 1

The effect of different anti-stiction coatings on the reflectivity of tantalum aluminum surfaces was tested. The control sample had no anti-stiction coating established thereon. The other anti-stiction coatings included perfluorooctanoic acid (PFOA), perfluorooctylhydroxamic acid (PFOHXA), fluorinated decyl tris(dimethylamino)silane (FDTDAS), and fluorinated decyl trichloro silane (FDTS). The PFOA, FDTDAS, and FDTS coatings were established via known deposition techniques, and the PFOHXA was established via an embodiment of the method disclosed therein.

Figure 4:
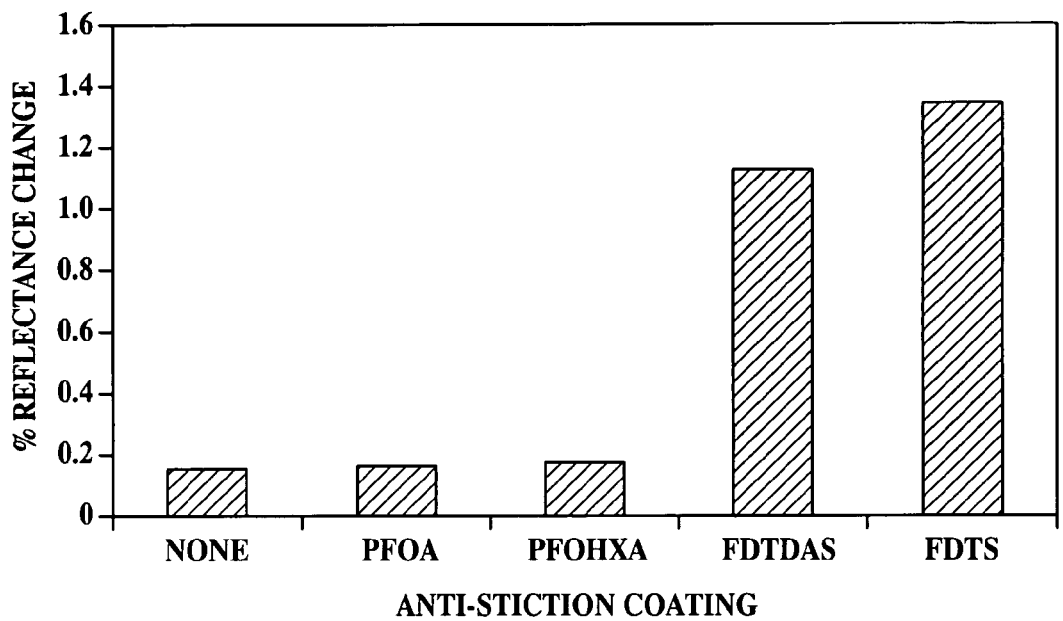
FIG. 4 is a graph depicting the effect of different anti-stiction coatings on the reflectivity of tantalum aluminum metal surfaces.

The reflectance values were measured on coupons of 1000 angstroms TaAl on tetra-ethyl-ortho-silicate (TEOS) wafers, both before and after being coated with the respective anti-stiction materials. The coating conditions were adjusted to obtain contact angles greater than 90°. The reflectance values were normalized to a percentage difference. These results are depicted in FIG. 4.

The reflectance changes with FDTS and FDTDAS ranged from approximately 1% to 1.5%. The FDTS coating required water to react with the TaAl surface, while the FDTDAS did not. The reaction time of FDTS and FDTDAS was about 15 minutes at 60° C.; and the reaction time of PFOA and PFOHXA was about 10 minutes at 60° C. The control sample (labeled "None" in FIG. 4) was also run in the vapor deposition tool with no anti-stiction coating at 60° C. for about 15 minutes.

As depicted, the change in reflectance for the PFOHXA was much less than the FDTDAS and FDTS coatings. Without being bound to any theory, it is believed that this is due to the lack of corrosive species formed during the PFOHXA reaction with metal.

EXAMPLE 2

The contact angles of aluminum copper surfaces having different anti-stiction coatings thereon were measured. A statistically significant number of aluminum copper coupons (1000 angstroms AlCu on TEOS wafers) were coated with either perfluorooctylhydroxamic acid (PFOHXA), fluorinated decyl tris(dimethylamino)silane (FDTDAS) and perfluorooctylhydroxamic acid (PFOHXA), or perfluorooctanoic acid (PFOA). The PFOA coating was established via a known deposition technique, and the PFOHXA and FDTDAS/PFOHXA coatings were established via embodiments of the method disclosed herein.

Figure 5:
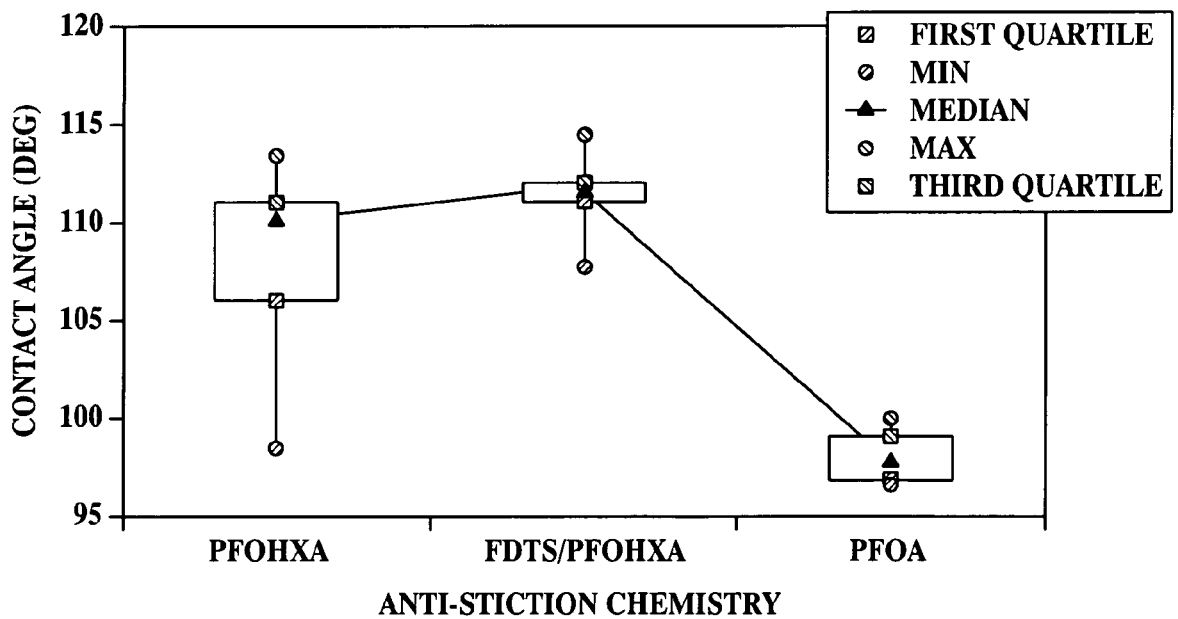
FIG. 5 is a graph depicting the contact angles of different anti-stiction coatings on aluminum copper metal surfaces.

As depicted in FIG. 5, the contact angles of AlCu surfaces coated with PFOHXA and FDTDAS/PFOHXA were statistically larger than the PFOA coated surfaces. Generally, contact angles over 90 degrees provide good coverage. Without being bound to any theory, it is believed that better protection is achievable as the contact angle increases.

While several embodiments have been described in detail, it will be apparent to those skilled in the art that the disclosed embodiments may be modified. Therefore, the foregoing description is to be considered exemplary rather than limiting.

What is claimed is:

1. A method for providing an anti-stiction coating on a metal surface, comprising reacting a vapor of perfluorooctylhydroxamic acid with the metal surface in a reaction chamber.

2. The method as defined in claim 1 wherein prior to reacting, the method further comprises subliming a solid of the perfluorooctylhydroxamic acid at a temperature ranging from about 70° C. to about 90° C.

3. The method as defined in claim 2 wherein subliming is accomplished in a vessel.

4. The method as defined in claim 3, further comprising selectively allowing the perfluorooctylhydroxamic acid vapor formed during subliming to flow from the vessel into an expansion chamber that is in selective fluid communication with the vessel.

5. The method as defined in claim 4 wherein a temperature of the expansion chamber ranges from about 70° C. to about 110° C., and wherein a pressure of the expansion chamber ranges from about 0.2 Torr to about 2 Torr.

6. The method as defined in claim 4 wherein the selective connection between the vessel and the expansion chamber is controlled via a valve.

7. The method as defined in claim 4 wherein the expansion chamber is in selective fluid communication with the reaction chamber, and wherein the method further comprises allowing an amount of the perfluorooctylhydroxamic acid vapor to flow from the expansion chamber into the reaction chamber so that pressure equilibrium is achieved.

8. The method as defined in claim 7 wherein the selective connection between the expansion chamber and the reaction chamber is controlled via an other valve.

9. The method as defined in claim 1 wherein a pressure of the reaction chamber ranges from about 30 mTorr to about 200 mTorr.

10. The method as defined in claim 1 wherein a temperature of the reaction chamber ranges from about 40° C. to about 70° C.

11. The method as defined in claim 1, further comprising flowing the perfluorooctylhydroxamic acid vapor over the metal surface for a predetermined time.

12. The method as defined in claim 1, further comprising purging the reaction chamber with nitrogen upon completion of reacting the perfluorooctylhydroxamic acid vapor with the metal surface.

13. The method as defined in claim 1 wherein the metal surface is a surface of a microelectromechanical system.

14. The method as defined in claim 1 wherein the metal surface substantially maintains its reflectance and smoothness after the reaction with the perfluorooctylhydroxamic acid vapor.

* * * * *